United States Patent
Mazkou et al.

(10) Patent No.: US 8,750,448 B2
(45) Date of Patent: Jun. 10, 2014

(54) FREQUENCY CALIBRATION APPARATUS OF FREQUENCY SYNTHESIZER AND FREQUENCY CALIBRATION METHOD THEREOF

(75) Inventors: Dzmitry Mazkou, Suwon-si (KR); Hyun-su Chae, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 1154 days.

(21) Appl. No.: 12/099,749

(22) Filed: Apr. 8, 2008

(65) Prior Publication Data

US 2009/0122937 A1 May 14, 2009

(30) Foreign Application Priority Data

Nov. 8, 2007 (KR) .................. 10-2007-0113961

(51) Int. Cl.
 *H03D 3/24* (2006.01)
(52) U.S. Cl.
 USPC ........... 375/376; 375/373; 375/374; 375/375; 375/327; 327/156; 327/157; 327/159; 331/16; 331/34; 331/1 R; 331/177 R
(58) Field of Classification Search
 USPC .......... 375/373–376, 327; 327/156, 157, 159; 331/16, 34, 1 R, 177 R
 See application file for complete search history.

(56) References Cited

U.S. PATENT DOCUMENTS

| | | | |
|---|---|---|---|
| 6,710,664 B2 | 3/2004 | Humphreys et al. | |
| 7,292,119 B2 * | 11/2007 | Urakawa | 331/179 |
| 7,804,367 B2 * | 9/2010 | Lee et al. | 331/16 |
| 2005/0083137 A1 | 4/2005 | Lee et al. | |
| 2007/0025491 A1 | 2/2007 | Jeong | |
| 2007/0040617 A1 | 2/2007 | Koukab et al. | |
| 2008/0106340 A1 | 5/2008 | Lee et al. | |

FOREIGN PATENT DOCUMENTS

| | | |
|---|---|---|
| JP | 2004-260387 | 9/2004 |
| KR | 10-0532476 | 11/2005 |
| KR | 10-2007-0009749 | 1/2007 |
| KR | 10-2007-0013483 | 1/2007 |
| KR | 10-0847687 | 7/2008 |
| WO | WO 2004/004126 | 1/2004 |

* cited by examiner

*Primary Examiner* — Phuong Phu
(74) *Attorney, Agent, or Firm* — NSIP Law

(57) ABSTRACT

A frequency calibration apparatus and method are provided. A frequency calibration method includes determining a frequency band according to results of frequency comparisons between a synchronized reference signal whose phase is synchronized to a phase of a prescale signal and a divided signal, and performing a Phase Locked Loop (PLL) operation on a reference signal and the divided signal at the determined frequency band to lock the divided signal.

15 Claims, 5 Drawing Sheets

FREQUENCY CALIBRATION APPARATUS OF FREQUENCY SYNTHESIZER AND FREQUENCY CALIBRATION METHOD THEREOF

CROSS REFERENCE TO RELATED APPLICATIONS

This application claims the benefit under 35 U.S.C. §119 (a) of a Korean Patent Application No. 10-2007-0113961, filed on Nov. 8, 2007, the disclosure of which is incorporated herein in its entirety by reference.

TECHNICAL FIELD

The following description relates to a frequency synthesizer, and more particularly, to a frequency calibration apparatus for rapidly detecting a frequency band to which a frequency that is to be synthesized belongs, so as to lock the frequency that is to be synthesized, and a frequency calibration method thereof.

BACKGROUND

Recently, technologies for providing various wireless communication services through a terminal have been developed. Wireless communication services include, for example, a Code Division Multiple Access (CDMA) service, a Global System for Mobile communication (GSM) service, and a Wireless broadband (Wibro) service.

In order to provide various wireless communication services, a frequency synthesizer that has a broadband voltage controlled oscillator (VCO) capable of accommodating frequency bands required by the wireless communication services is desired. When a wireless communication service is changed, a frequency synthesizer changes a frequency within a frequency band which is manually selected from among multiple bands of a VCO for dividing a broad bandwidth into multiple bands, or changes a frequency through a VCO frequency band which covers multiple frequency bands.

However, there are difficulties in applying a technique of changing a frequency within a band that is manually selected to wireless communication services requiring fast channel switching.

Meanwhile, a technique of changing a frequency using a VCO that covers multiple frequency bands may reduce a time required for channel switching, but may deteriorate noise characteristics of a frequency synthesizer because the VCO gain is relatively high.

SUMMARY

According to an aspect, there is provided a frequency calibration apparatus of a frequency synthesizer, which automatically selects a band to which a frequency that is to be synthesized belongs, from among a plurality of frequency bands provided by a voltage controlled oscillator (VCO), and a frequency calibration method thereof.

According to another aspect, there is provided a frequency calibration apparatus of a frequency synthesizer, which performs a binary search of VCO control bits according to results of comparisons between a reference frequency and a divided frequency of VCO that is to be synthesized so as to determine a frequency band, and performs Phase Locked Loop (PLL) operation with respect to the determined frequency band to lock the frequency that is to be synthesized, and a frequency calibration method thereof.

According to still another aspect, there is provided a frequency calibration apparatus of a frequency synthesizer, including a band determination unit determining a frequency band according to results of frequency comparisons between a synchronized reference signal whose phase is synchronized to a phase of a prescale signal and a divided signal, and a phase locked loop (PLL) unit performing a PLL operation on a reference signal and the divided signal at the determined frequency band to lock the divided signal.

The band determination unit may perform a binary search on the basis of the results of the frequency comparisons, thereby determining the frequency band.

The band determination unit may performs the binary search on bits ranging from a most significant bit (MSB) to a least significant bit (LSB) of N control bits of $2^N$ frequency bands which are capable of being selected by the frequency synthesizer, in such a manner as to select an upper frequency region if the frequency of the synchronized reference signal is higher than the frequency of the divided signal, to select a lower frequency region if the frequency of the synchronized reference signal is lower than the frequency of the divided signal.

According to yet another aspect, there is provided a frequency calibration method performed by a frequency synthesizer, including determining a frequency band according to results of frequency comparisons between a synchronized reference signal whose phase is synchronized to a phase of a prescale signal and a divided signal, and performing a Phase Locked Loop (PLL) operation on a reference signal and the divided signal at the determined frequency band to lock the divided signal.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, the same drawing reference numerals will be understood to refer to the same elements, features, and structures.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1:
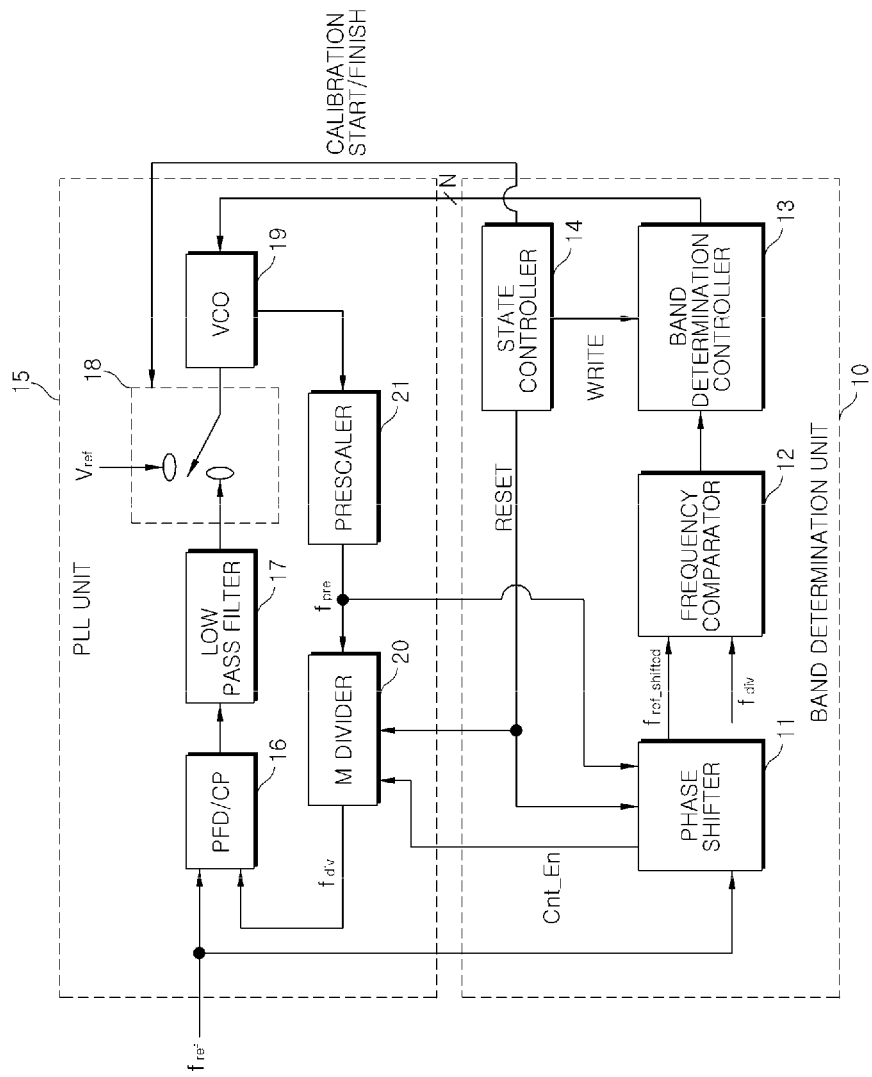
FIG. 1 is a block diagram of a frequency calibration apparatus of a frequency synthesizer, according to an exemplary embodiment.

FIG. 1 is a block diagram of a frequency calibration apparatus of a frequency synthesizer, according to an exemplary embodiment.

The frequency calibration apparatus includes a band determination unit 10 and a phase locked loop (PLL) unit 15.

The band determination unit 10 determines a frequency band according to results of frequency comparisons between a synchronized reference signal $f_{ref\_shifted}$ whose phase is synchronized to a phase of a prescale signal $f_{pre}$ and a divided signal $f_{div}$.

The band determination 10 synchronizes a phase of a reference signal $f_{ref}$ to the phase of a prescale signal $f_{pre}$, compares the frequency of the divided signal $f_{div}$ with the frequency of the synchronized reference signal $f_{ref\_shifted}$, and performs a binary search on bits ranging from the most significant bit (MSB) to the least significant bit (LSB) of N control bits of $2^N$ frequency bands which can be selected by the frequency synthesizer, according to the results of the frequency comparisons, thereby determining a frequency band. The prescale signal $f_{pre}$ is obtained by scaling a signal outputted from a voltage controlled oscillator (VCO) 19 at a predetermined ratio in the prescaler 21, and the divided signal $f_{div}$ is obtained by M-dividing the prescale signal $f_{pre}$ in the M divider 20. Also, the N control bits of the $2^N$ frequency bands are control bits of a varactor bank of the VCO 19.

After the determination of the frequency band, the PLL unit 15 performs a PLL operation on the reference signal $f_{ref}$ and the divided signal $f_{div}$ in the frequency band determined by the band determination unit 10, and thus locks the divided signal $f_{div}$.

The operation of the band determination unit 10 and the PLL unit 15 will be described below with reference to FIG. 1.

The band determination unit 10 includes a phase shifter 11, a frequency comparator 12, a band determination controller 13, and a state controller 14.

Where channel switching is performed to change a wireless communication service, the state controller 14 generates a reset signal and transfers the reset signal to the phase shifter 11 and the M divider 20, generates a calibration start signal and transfers the calibration start signal to a switching unit 18, generates a write signal and transfers the write signal to the band determination controller 13.

Also, where the frequency band is determined, the state controller 14 generates a calibration finish signal, transfers the calibration signal to the switching unit 18 to apply an output voltage of a low-pass filter 17 to the VCO 19. The frequency band is determined by performing a binary search for a time corresponding to a product of predetermined periods of the reference signal and the number (N) of control bits of the varactor bank of the VCO 19 in the frequency synthesizer.

The predetermined periods of the reference signal are the amount of time used to complete a search of a bit of the N control bits of the varactor bank of the VCO 19, and in an exemplary embodiment, the time corresponds to 4 periods of the reference signal. The total calibration time is calculated as follows:

Total calibration time=N*4T. N is number of control bits in the varactor bank, and T is period of the reference signal. The phase shifter 11 shifts the reference signal $f_{ref}$ by a difference between the phase of the reference signal $f_{ref}$ and the phase of the prescale signal $f_{pre}$, thus synchronizing the phase of the reference signal $f_{ref}$ to the phase of the prescale signal $f_{pre}$. That is, the phase shifter 11 synchronizes a rising edge of the reference signal $f_{ref}$ to a rising edge of the prescale signal $f_{pre}$.

The phase shifter 11 is initialized in response to a reset signal received from the state controller 14, generates a divider enable signal Cnt_En where the reset state is terminated, provides the divider enable signal Cnt_En to the M divider 20 and outputs the synchronized reference signal $f_{ref\_shifted}$ to the frequency comparator 12. The M divider 20 is initialized in response to the reset signal, and enabled in response to the divider enable signal Cnt_En to M-divide the prescale signal $f_{pre}$ and outputs the result as the divided signal $f_{div}$. The reset signal may be generated for a period of the reference signal.

The frequency comparator 12 compares the frequency of the synchronized reference signal $f_{ref\_shifted}$ with the frequency of the divided signal $f_{div}$ received from the M divider 20. The frequency comparator 12 outputs a logic "high" signal to the band determination controller 13 where the frequency of the synchronized reference signal $f_{ref\_shifted}$ is higher than the frequency of the divided signal $f_{div}$, and outputs a logic "low" signal to the band determination controller 13 where the frequency of the synchronized reference signal $f_{ref\_shifted}$ is lower than the frequency of the divided signal $f_{div}$.

The band determination controller 13 performs a binary search on bits ranging from the MSB to the LSB of the N control bits of the varactor bank of the VCO 19, according to the results of the frequency comparisons, to determine values of the N control bits, thereby determining a frequency band.

The band determination controller 13 performs a binary search on available frequency bands from the MSB to LSB of the N control bits of the varactor bank of the VCO 19, in such a manner as to select an upper frequency region in response to a logic "high" signal and select a lower frequency region in response to a logic "low" signal, to determine values of the N control bits, thereby determining a frequency band.

The results of the comparison obtained by the frequency comparator 12 may be stored in a flip-flop included in the band determination controller 13, in response to a write signal which is generated by the state controller 14.

According to an aspect, where the frequency band is determining, the amount of time used to determine a bit of the N control bits of the varactor bank of the VCO 19 may be 4 periods of the reference signal $f_{ref}$.

A conventional technique of determining a frequency band through binary searching utilizes counters to compare the frequency of a reference signal with the frequency of a divided signal. That is, in the conventional technique, by comparing the frequency of a reference signal with the frequency of a divided signal using an output signal of a counter which receives the reference signal as an input clock signal and an output signal of a counter which receives the divided signal as an input clock signal, and determining values of the control bits of a varactor bank of a VCO according to the results of the comparisons, a frequency band that is to be synthesized is selected.

Since the conventional technique compares frequencies using the output signals of the K-bit counters, a time of $2^K \times$(a reference frequency period) may be required to determine a value of a bit of the N control bits of the varactor bank of the VCO.

For example, where an 8-bit counter operates using a reference signal of 20 MHz, the conventional technique may require a time of 256×50 ns to determine a value of a bit of N control bits of a varactor bank of a VCO. In the exemplary embodiment disclosed above, that time required may be only 4×50 ns.

Accordingly, by rapidly detecting a band to which a frequency that is to be synthesized belongs, a time required for channel switching can be significantly reduced.

Also, the amount of time saved by rapidly detecting a band to which the frequency that is to be synthesized belongs may be assigned to the PLL operation. Therefore, by improving the flexibility of selecting a loop filter coefficient where a PLL is designed, the PLL's performance may be enhanced.

The PLL unit 15 will now be described.

The PLL unit 15 includes a Phase Frequency Detector (PFD)/Charge Pump (CP) unit 16, a low pass filter (LPF) 17, a switching unit 18, a VCO 19, an M divider 20, and a prescaler 21.

The PFD/CP unit 16 compares a reference signal $f_{ref}$ with a divided signal $f_{div}$, generates a pulse stream corresponding to a difference between the reference signal $f_{ref}$ and the divided signal $f_{div}$, and outputs current which is proportional to a pulse width of the pulse stream to the low pass filter 17.

The low pass filter 17 removes noise included in the current, and generates a voltage corresponding to current from which the noise has been removed.

The switching unit 18 performs a switching operation to apply a reference voltage $V_{ref}$ to the VCO 19, in response to the calibration start signal from the state controller 14, and performs a switching operation to apply the output voltage of the low pass filter 17 to the VCO 19, in response to the calibration finish signal from the state controller 14.

The VCO 19 generates a signal having a frequency corresponding to the voltage generated by the low pass filter 17, in a frequency band corresponding to the N control bits which are determined by the band determination unit 10.

The prescaler 21 scales the frequency of the signal generated by the VCO 19 at a predetermined ratio, for example, at a ratio of 1/8, thus outputting a prescale signal $f_{pre}$.

The M divider 20 is initialized in response to a reset signal which is generated by the state controller 14 and enabled in response to a divider enable signal Cnt_En which is generated by the phase shifter 11 after the reset state is terminated, and M-divides the prescale signal $f_{pre}$ to output a divided signal $f_{div}$.

As described above, in the frequency calibration apparatus of the frequency synthesizer according to the exemplary embodiment, by synchronizing the phase of a reference signal with the phase of the prescale signal, comparing the frequency of a divided signal with the frequency of the synchronized reference signal, determining a frequency band according to the results of the comparisons, and performing a PLL operation on the reference signal and the divided signal at the determined frequency band to lock the divided signal, it is possible to stably provide a wireless communication service requiring fast channel switching, and improve noise characteristics of the frequency synthesizer without having to utilize a VCO having high frequency gain.

Figure 2:
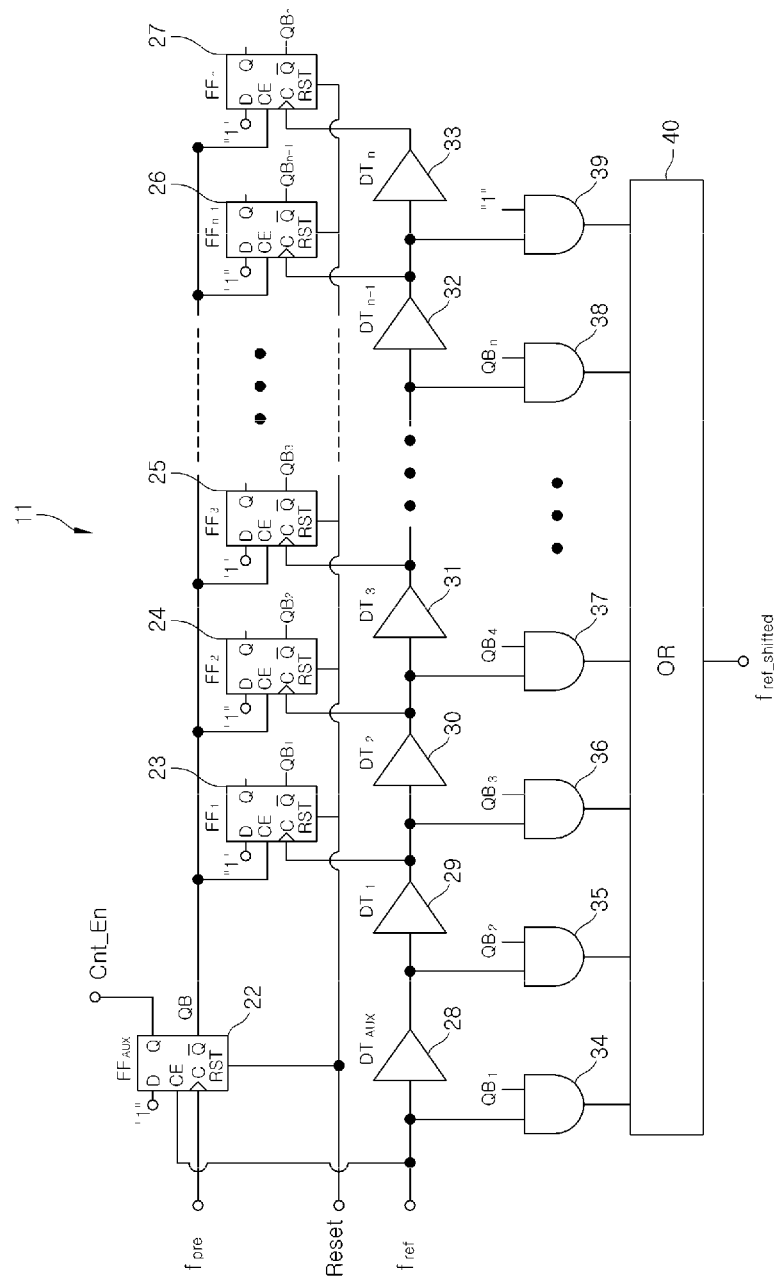
FIG. 2 is a circuit diagram of a phase shifter according to an exemplary embodiment.

FIG. 2 is a circuit diagram of the phase shifter 11 illustrated in FIG. 1, according to an embodiment.

As illustrated in FIG. 2, the phase shifter 11 includes a main flip-flop 22, a plurality of delay buffers 28, 29, ..., 32, 33, a plurality of flip-flops 23, 24, ..., 26, 27, a plurality of AND gates 34, 35, ..., 38, 39, and an OR gate 40.

The operation of the phase shifter 11 will now be described with reference to FIGS. 1 and 2.

If a reset signal is generated by the state controller 2, the main flip-flop 22 outputs a logic "high" signal as an output signal QB. Accordingly, the plurality of flip-flops 23 through 27 output logic "High" signals as output signals QB1 through QBn.

The plurality of AND gates 34 through 39 perform an AND operation on the output signals of the plurality of delay buffers 28 through 33 and the output signals of the plurality of flip-flops 23 through 27 to output a plurality of logic "low" signals, and the OR gate performs an OR operation on the logic "low" signals to output a logic "low" signal. Accordingly, the synchronized reference signal $f_{ref\_shifted}$ whose phase is not synchronized yet is outputted as a logic "low" signal.

At this time, a total delay time of the plurality of delay buffers 28 through 33 may be long enough to include a period of a prescale signal $f_{pre}$ in consideration of the margin of a manufacturing process. Accordingly, the number of the delay buffers 28 through 33 may be determined so that the total delay time of the plurality of delay buffers 28 through 33 is long enough to include a period of a prescale signal $f_{pre}$ in consideration of the margin of a manufacturing process.

After the reset state is terminated, the output signal QB of the main flip-flop 22 remains unchanged until receiving the rising edge of the reference signal $f_{ref}$. Where the rising edge of the reference signal $f_{ref}$ is received, the plurality of flip-flops 23 through 27 are maintained in an enabled state, and the output signals $QB_1$ through QBn of the plurality of flip-flops 23 through 27 are sequentially changed to logic "low" signals by reference signals $DT_1, DT_2, \ldots$, which are delayed replica of the reference signal $f_{ref}$ while it propagates through the delay buffers 28 through 33.

However, where the prescale signal $f_{pre}$ is received, the main flip-flop 22 generates a divider enable signal Cnt_En to enable the M divider 20, and simultaneously outputs a logic "low" signal as an output signal QB to disable clock signal for the plurality of flip-flops 23 through 27. Here, the plurality of flip-flops 23 through 27 saves number of zeros on the output of QB1 toward QBn which are proportional to the time difference between the rising edge of the reference signal $f_{ref}$ and the rising edge of the prescale signal $f_{pre}$. Meanwhile, the rest of flip-flops keep high states on the output.

At the next rising edge of the reference signal $f_{ref}$, the OR gate 40 outputs a reference signal $f_{ref\_shifted}$ whose rising edge is closest to a rising edge of the prescale signal $f_{pre}$, from among the reference signals $DT_1$ through $DT_n$.

However, the phase shifter 11 described above is provided as only an example, and various other known or to be known alternatives and/or modifications are possible.

Figure 3:
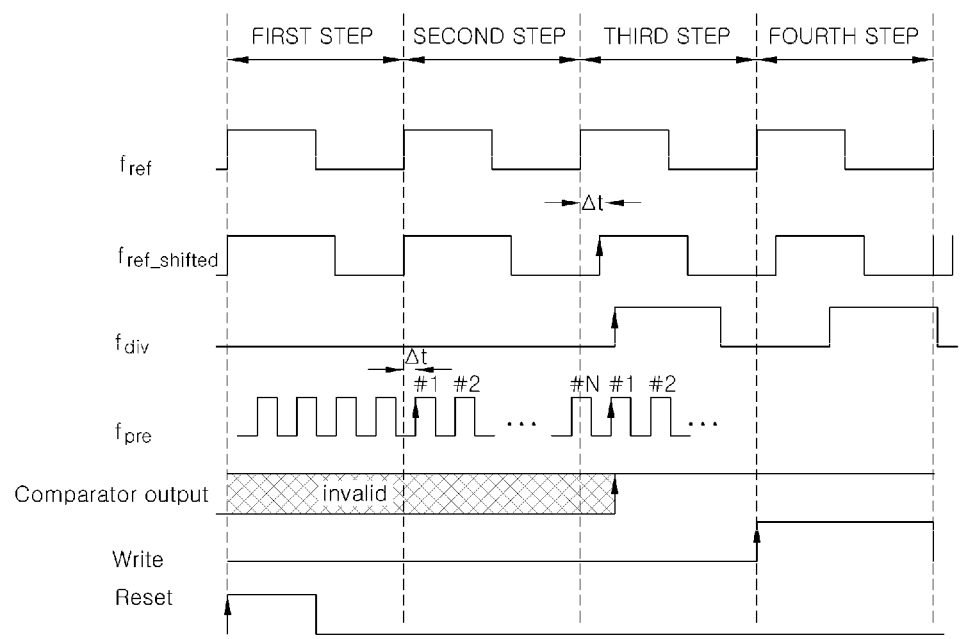
FIG. 3 is a waveform for a determination state of a VCO control bit.

FIG. 3 is a waveform for determinating state of a VCO control bit.

As illustrated in FIG. 3, the frequency calibration method may include four steps: first through fourth steps. Here, each step may correspond to a period of a reference signal $f_{ref}$. Referring to FIGS. 1 and 3, in the first step the state controller 14 generates a reset signal and provides the reset signal to the phase shifter 11 and the M divider 20, and in the fourth step the state controller 14 generates a write signal and provides the write signal to the band determination controller 13.

In the second step, a difference between a phase of a reference signal $f_{ref}$ and a phase of a prescale signal $f_{pre}$ is measured, and the reference signal $f_{ref}$ is shifted by the difference, so that the phase of the reference signal $f_{ref}$ is synchronized to the phase of the prescale signal $f_{pre}$.

In the second step, the M divider 20 is enabled in response to a divider enable signal Cnt_En generated by the phase shifter 11, and M-divides the prescale signal $f_{pre}$ to generate a divided signal $f_{div}$.

In the third step, the frequency of a synchronized reference signal $f_{ref\_shifted}$ whose phase is synchronized to the phase of the prescale signal $f_{pre}$ is compared with the frequency of the divided signal $f_{div}$.

That is, the frequency comparator 12 compares the frequency of the synchronized reference signal $f_{ref\_shifted}$ with the frequency of the divided signal $f_{div}$, and outputs the result of the comparison.

The frequency comparator 12 may be a flip-flop.

For example, the frequency comparator 12 is a flip-flop which receives the synchronized reference signal $f_{ref\_shifted}$ through a data input terminal and receives the divided signal $f_{div}$ through a clock terminal. Accordingly, the frequency comparator 12 outputs a logic "high" signal where the frequency of the synchronized reference signal $f_{ref\_shifted}$ is higher than the frequency of the divided signal $f_{div}$, and outputs a logic "low" signal where the frequency of the synchronized reference signal $f_{ref\_shifted}$ is lower than the frequency of the divided signal $f_{div}$.

The band determination controller 13 determines whether to set MSB to a logic "high" level or to a logic "low" level, according to the result of the frequency comparison.

Where the value of the MSB is determined, the band determination controller 13 determines whether to set the next lower bit (MSB−1) of the MSB of the control bits to a logic "high" level or to a logic "low" level, according to the result of the frequency comparison.

In this way, by repeating the process until the LSB of the N control bits is processed, a frequency band is determined.

The result of the frequency comparison may be stored in the flip-flop included in the band determination controller 13, in response to a write signal which is generated by the state controller 14.

Figure 4:
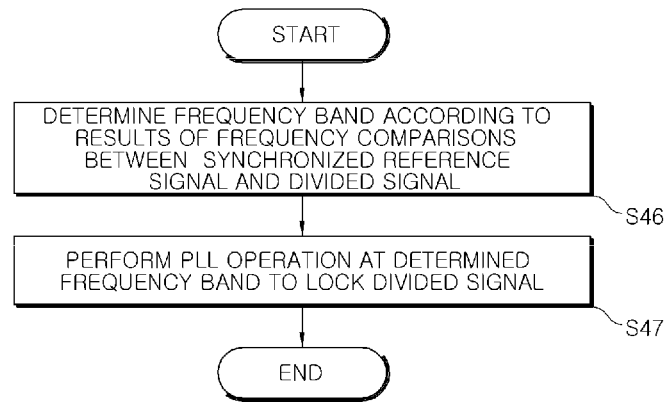
FIG. 4 is a flowchart of a channel switching method according to an exemplary embodiment.

FIG. 4 is a flowchart of a channel switching method, according to an embodiment.

Referring to FIG. 4, where channel switching is performed to change a wireless communication service, the frequency synthesizer determines a frequency band according to results of frequency comparisons between a synchronized reference signal whose phase is synchronized to a phase of a prescale signal and a divided signal (S45), and performs a PLL operation on a reference signal and the divided signal at the determined frequency band to lock the divided signal (S46).

The frequency synthesizer applies a reference voltage to a VCO, generates the prescale signal through a prescaler corresponding to the reference voltage, and synchronizes the phase of the reference signal with the phase of the prescale signal.

The frequency synthesizer compares the frequency of the synchronized reference signal whose phase is synchronized to the phase of the prescale signal, with the phase of the divided signal from a M-divider, and determines state of a control bit of a varactor bank of the VCO according to the result of the comparison.

That is, the frequency synthesizer performs the process described above on bits ranging from the MSB to the LSB of the control bits of the varactor bank of the VCO, thereby determining a frequency band (operation S46).

The frequency synthesizer performs a PLL operation on the reference signal and the divided signal at the determined frequency band to lock the divided signal (operation S47), thereby completing the channel switching method.

As described above, in the exemplary frequency calibration method, by determining a frequency band according to results of frequency comparisons between a synchronized reference signal whose phase is synchronized to a phase of a prescale signal and a divided signal, and performing a PLL operation on a reference signal and the divided signal at the determined frequency band to lock the divided signal, it is possible to stably provide a wireless communication service requiring fast channel switching and improve noise characteristics of a frequency synthesizer without having to utilize a VCO having high frequency gain.

Figure 5:
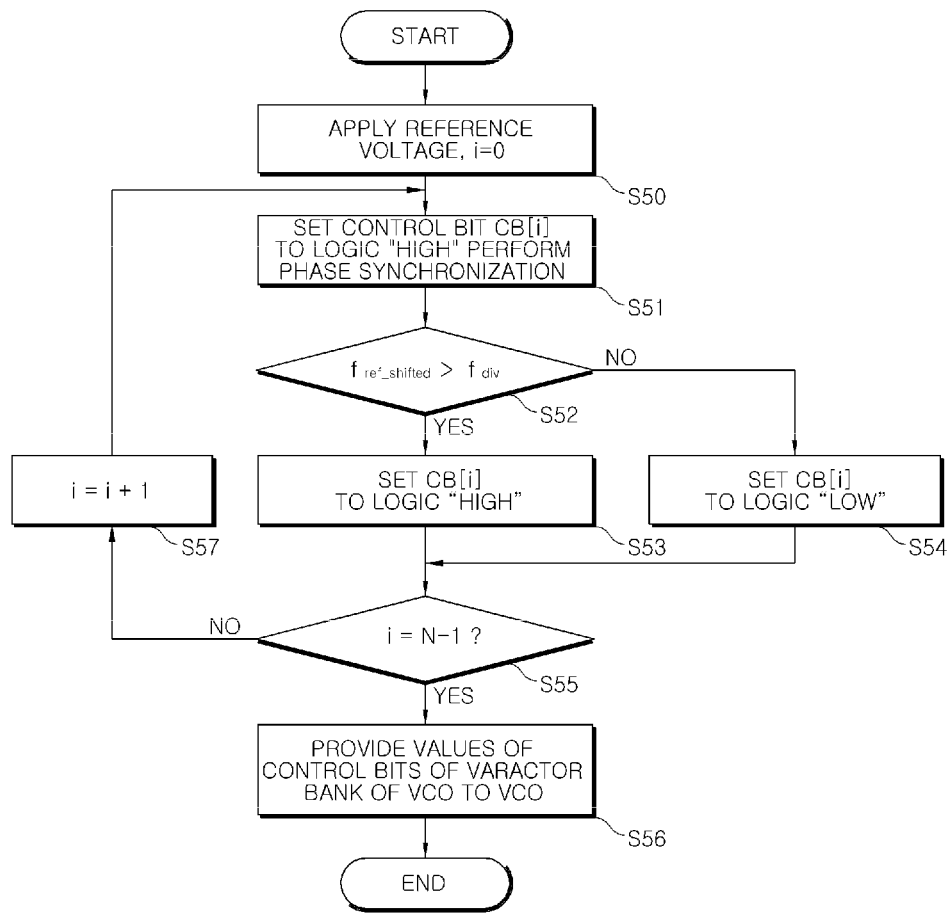
FIG. 5 is a flowchart of a frequency band determination method according to an exemplary embodiment.

FIG. 5 is a flowchart of a frequency band determining method according to an embodiment.

The frequency band determining method may be performed by the frequency calibration apparatus illustrated in FIG. 1. Accordingly, the frequency band determining method will be described with reference to the construction of the frequency calibration apparatus illustrated in FIG. 1, below.

The switching unit 18 applies a reference voltage $V_{ref}$ to the VCO 19, in response to the calibration start signal from the state controller 14, and initializes an incremental variable "i" to "0 (operation S50).

The band determination controller 13 sets control bit CB[i] to a logic "high," and the phase shifter 11 synchronizes the phase of a reference signal $f_{ref}$ with the phase of a prescale signal $f_{pre}$ (operation S51).

The phase shifter 11 generates a divider enable signal Cnt_En and provides the divider enable signal Cnt_En to the M divider 20, in operation S51. Thus, the M divider 20 is enabled in response to the divider enable signal Cnt_En, and M divides the prescale signal $f_{pre}$ to generate a divided signal $f_{div}$.

The frequency comparator 12 compares the frequency of a synchronized reference signal $f_{ref\_shifted}$ whose phase is synchronized to the phase of the prescale signal $f_{pre}$, with the frequency of the divided signal $f_{div}$, and determines whether the frequency of the synchronized reference signal $f_{ref\_shifted}$ is higher than the frequency of the divided signal $f_{div}$ (operation S52).

The frequency comparator 12 outputs a logic "high" signal where the frequency of the synchronized reference signal $f_{ref\_shifted}$ is higher than the frequency of the divided signal $f_{div}$. The band determination controller 13 sets CB[i] to a logic "high" level, in response to the logic "high" signal, and selects an upper frequency region according to the logic "high" level (operation S53).

The frequency comparator 12 outputs a logic "low" signal to the band determination controller 13 where the frequency of the synchronized reference signal $f_{ref\_shifted}$ is lower than the frequency of the divided signal $f_{div}$. The band determination controller 13 sets CB[i] to a logic "low" level, in response to the logic "low" signal, and selects a lower frequency region according to the logic "low" level (operation S54).

The band determination controller 13 determines whether the incremental variable "i" is equal to the number (N−1) of control bits (operation S55). Where the incremental variable "i" is not equal to the number (N−1) of control bits, the band determination controller 13 increases the incremental variable "i" by "1" (operation S57). Then, the band determination controller 13 proceeds to operation S51 and performs the following process. That is, the band determination controller 13 performs a binary search on bits ranging from the MSB to the LSB of the control bits.

Where the incremental variable "i" is equal to the number (N−1) of control bits, the band determination controller 13 provides to the VCO 19 values of the control bits of the varactor bank of the VCO 19, which are obtained by performing the binary search (operations S50 through S56).

Where a frequency band is determined in the frequency synthesizer according to an exemplary embodiment, the amount of time used to determine a bit of the N control bits of the varactor bank of the VCO 19 may be 4 periods of the reference signal $f_{ref}$.

A conventional technique of determining a frequency band through binary searching utilizes counters to compare the frequency of a reference signal with the frequency of a divided signal. That is, by comparing the frequency of a reference signal with the frequency of a divided signal using an output signal of a counter which receives the reference signal as an input clock signal and an output signal of a counter which receives the divided signal as an input clock signal, and determining values of control bits of the varactor bank of the VCO using the result of the comparison, a frequency band that is to be synchronized is selected.

In the conventional technique, since frequencies are compared using the output signals of counters, a time corresponding to $2^N \times$(a reference frequency period) is required to determine a bit of N control bits of the varactor bank of the VCO.

For example, where an 8-bit counter operates according to a reference signal of 20 MHz, the conventional technique may take $2^N \times 50$ ns. In an exemplary embodiment, it may takes $4 \times 50$ ns in order to determine a bit of N control bits of the varactor bank of the VCO.

According to certain embodiments described above, by rapidly detecting a band to which a frequency that is to be synthesized belongs, a time required for channel switching may be significantly reduced.

Also, the amount of time saved by rapidly detecting a band to which a desired frequency belongs may be assigned to the PLL operation. Accordingly, it is possible to improve flexibility in designing a PLL. Therefore, it is possible to improve flexibility of selecting a loop filter coefficient where a PLL is designed, and enhance the PLL's performance.

The methods described above may be recorded, stored, or fixed in one or more computer-readable media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. The media may also be a transmission medium such as optical or metallic lines, wave guides, and the like including a carrier wave transmitting signals specifying the program instructions, data structures, and the like. Examples of program instructions include both machine code, such as produced by a compiler, and files containing higher level code that may be executed by the computer using an interpreter. The described hardware devices may be configured to act as one or more software modules in order to perform the operations and methods described above.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A frequency calibration apparatus of a frequency synthesizer, the apparatus comprising:
    a band determination unit determining a frequency band according to results of frequency comparisons between a synchronized reference signal that comprises a phase that is synchronized to a phase of a prescale signal, and a divided signal; and
    a phase locked loop (PLL) unit performing a PLL operation on a reference signal and the divided signal at the determined frequency band to lock the divided signal,
    wherein the band determination unit performs a binary search on bits ranging from a most significant bit (MSB) to a least significant bit (LSB) of N control bits of $2^N$ frequency bands.

2. The frequency calibration apparatus of claim 1, wherein the band determination unit performs the binary search based on the results of the frequency comparisons so as to determine the frequency band.

3. The frequency calibration apparatus of claim 2, wherein the band determination unit performs the binary search on bits ranging from a most significant bit (MSB) to a least significant bit (LSB) of N control bits of $2^N$ frequency bands which are capable of being selected by the frequency synthesizer, so as to select an upper frequency region where the frequency of the synchronized reference signal is higher than the frequency of the divided signal, and to select a lower frequency region where the frequency of the synchronized reference signal is lower than the frequency of the divided signal.

4. The frequency calibration apparatus of claim 2, wherein the band determination unit comprises:
    a phase shifter synchronizing the phase of the reference signal with a phase of the prescale signal;
    a comparator comparing the frequency of the synchronized reference signal with the frequency of the divided signal; and
    a band determination controller performing the binary search on control bits, according to the results of the frequency comparisons, so as to determine the frequency band.

5. A frequency calibration method which is performed by a frequency synthesizer, the method comprising:
    determining a frequency band according to results of frequency comparisons between a synchronized reference signal that comprises a phase that is synchronized to a phase of a prescale signal, and a divided signal; and
    performing a Phase Locked Loop (PLL) operation on a reference signal and the divided signal at the determined frequency band to lock the divided signal,
    wherein the determining of the frequency band comprises performing a binary search on bits ranging from a most significant bit (MSB) to a least significant bit (LSB) of N control bits of $2^N$ frequency bands.

6. The frequency calibration method of claim 5, wherein determining a frequency band according to results of frequency comparisons between a synchronized reference signal whose phase is synchronized to a phase of a prescale signal, and a divided signal comprises further performing the binary search based on the results of the frequency comparisons, so as to determine the frequency band.

7. The frequency calibration method of claim 6, wherein the determining of the frequency band comprises performing the binary search on bits ranging from a most significant bit (MSB) to a least significant bit (LSB) of N control bits of $2^N$ frequency bands which are capable of being selected by the frequency synthesizer, so as to select an upper frequency region where the frequency of the synchronized reference signal is higher than the frequency of the divided signal, and to select a lower frequency region where the frequency of the synchronized reference signal is lower than the frequency of the divided signal.

8. The frequency calibration apparatus of claim 4, wherein the phase locked loop (PLL) unit further comprises an M divider, and wherein the phase shifter provides a divider enable signal to the M divider.

9. The frequency calibration apparatus of claim 4, wherein the comparator outputs a first logic signal to the band determination controller where a frequency of the synchronized reference signal is higher than the frequency of the divided signal, and wherein the comparator outputs a second logic signal to the band determination controller where the frequency of the synchronized reference signal is lower than the frequency of the divided signal.

10. The frequency calibration apparatus of claim 2, wherein the band determination unit performs the binary search on bits ranging from the most significant bit (MSB) to the least significant bit (LSB) of N control bits of $2^N$ frequency bands which are capable of being selected by the frequency synthesizer.

11. The frequency calibration apparatus of claim 2, wherein the band determination unit select an upper frequency region where the frequency of the synchronized reference signal is higher than the frequency of the divided signal, and select a lower frequency region where the frequency of the synchronized reference signal is lower than the frequency of the divided signal.

12. The frequency calibration apparatus of claim 4, wherein the phase shifter comprises:
a main flip-flop;
a delay buffer connected to the main flip-flop;
a flip-flop connected to the main flip-flop and the delay buffer;
an AND gate connected to the flip flop; and
an OR gate connected to the AND gate.

13. A frequency calibration method that is performed by a frequency synthesizer, the method comprising:
applying a reference signal;
synchronizing a phase of the reference signal with a phase of a prescale signal;
generating a divider enable signal during the synchronizing to divide the prescale signal to generate a divided signal;
comparing a frequency of the synchronized reference signal with a frequency of the divided signal; and
determining a frequency band for channel switching based on the comparison of the frequency of the synchronized reference signal and the frequency of the divided signal.

14. The frequency calibration method of claim 13, further comprising performing a phase locked loop (PLL) operation on the reference signal and the divided signal at the determined frequency band to lock the divided signal.

15. The frequency calibration method of claim 13, wherein the determining comprises performing a binary search on bits ranging from a most-significant bit (MSB) to a least-significant bit (LSB) among N control bits of a varactor bank of a voltage controlled oscillator (VCO), according to the results of the frequency comparisons, to determine the frequency band.

* * * * *